(12) United States Patent
Kadota

(10) Patent No.: US 6,291,923 B1
(45) Date of Patent: Sep. 18, 2001

(54) SURFACE ACOUSTIC WAVE DEVICE

(75) Inventor: Michio Kadota, Kyoto (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/221,892

(22) Filed: Dec. 28, 1998

(30) Foreign Application Priority Data

Jan. 13, 1998 (JP) .................................................. 10-004879

(51) Int. Cl.$^7$ ...................................................... H01L 41/08
(52) U.S. Cl. ............................................................ 310/313 A
(58) Field of Search .......................... 310/313 A, 313 B, 310/313 D; 333/150–155, 193–196

(56) References Cited

U.S. PATENT DOCUMENTS

| | | | |
|---|---|---|---|
| 3,828,283 | * 8/1974 | Daniel | 310/313 A X |
| 3,952,268 | * 4/1976 | Schulz et al. | 310/313 A |
| 4,223,286 | 9/1980 | Ono et al. | 310/313 A |
| 4,409,570 | * 10/1983 | Tanski | 310/313 A X |
| 4,501,987 | 2/1985 | Mitsuyu et al. | 310/313 A |
| 5,895,996 | * 4/1999 | Takagi et al. | 310/313 A X |

FOREIGN PATENT DOCUMENTS

| | | |
|---|---|---|
| 0 602 666 | 6/1994 | (EP) . |
| 0 616 426 | 9/1994 | (EP) . |
| 0 762 640 A1 | 3/1997 | (EP) . |

* cited by examiner

Primary Examiner—Mark O. Budd
(74) Attorney, Agent, or Firm—Keating & Bennett, LLP

(57) ABSTRACT

A surface acoustic wave device includes a quartz substrate, a reflector disposed on the quartz substrate, a piezoelectric thin film disposed on a portion of the quartz substrate which excludes at least a portion of the quartz substrate on which the reflector is disposed, and an interdigital transducer disposed to contact the piezoelectric thin film.

14 Claims, 6 Drawing Sheets

SURFACE ACOUSTIC WAVE DEVICE

BACKGROUND OF THE INVENTION

1. Field of the Invention

The present invention relates to a surface acoustic wave device having a quartz substrate.

2. Description of the Related Art

There has been a great demand for filters which have a middle frequency bandwidth for use in mobile communication equipment and other consumer electronic devices. In general, a bandwidth of a surface acoustic wave device is proportional to a square of an electromechanical coefficient K ($K^2$) of the device.

A surface acoustic wave device having a quartz substrate is desirable because a temperature coefficient of group delay time (TCD) thereof is nearly zero. However, quartz substrates essentially have a low $K^2$ value, and a band width of a surface acoustic wave device including a quartz substrate is therefore narrow. More specifically, a component including a plurality of conventional surface acoustic wave devices each having an interdigital transducer (IDT) and disposed on a conventional quartz substrate has a $K^2$ value of about 0.14%.

Substrates made of materials such as $LiTaO_3$ have large values of $K^2$, but the bandwidth of a surface acoustic wave device having such a substrate is too wide to satisfy the above-described demand, since the $K^2$ value is too large. In addition, the substrates made of $LiTaO_3$ and the like have a high TCD value, which causes the characteristics to change greatly depending on temperature.

To solve these problems, a surface acoustic wave device having an enhanced $K^2$ value has been proposed. This surface acoustic wave device is produced by forming a piezoelectric thin film on a quartz substrate and forming an interdigital transducer on the piezoelectric thin film.

This conventional surface acoustic wave device 110 will be now described with reference to FIGS. 10 and 11. FIG. 10 is a schematic plan view of the conventional surface acoustic wave device 110. FIG. 11 is a cross-section taken along line W—W of FIG. 10.

As shown in FIGS. 10 and 11, the conventional surface acoustic wave device 110 is constructed by forming a piezoelectric thin film 112 such as a ZnO film and the like on a quartz substrate 111. On the piezoelectric thin film 112, an interdigital transducer 113 having a pair of comb-shaped electrodes which are interdigitated with each other is formed of Al. A pair of reflectors 114 are provided on opposite sides of the interdigital transducer 113. The reflectors 114 are provided to reflect surface acoustic waves propagated thereto and to confine the energy of the surface acoustic waves. Thus, the surface acoustic wave device 110 functions as a resonator. One or a plurality of the surface acoustic devices are used to form a band-pass filter. The $K^2$ value of the surface acoustic wave device 110 can be enhanced by use of the quartz substrate 111 having a cut angle and a propagation direction selected to achieve a negative TCD value. By using the piezoelectric thin film 112 which has a positive TCD value, the TCD values of the quartz substrate 111 and the piezoelectric thin film 112 can be canceled. Accordingly, the TCD value of the surface acoustic wave device 110 can be adjusted to be close to zero.

The $K^2$ value of the surface acoustic wave device 110 can be enhanced by providing a short circuiting electrode made of Al or the like, between the quartz substrate 111 and the piezoelectric thin film 112.

Thus, the conventional surface acoustic wave device 110 has a desired $K^2$ value of about 1% in addition to a TCD value of about zero, thereby realizing a surface acoustic wave device having a middle bandwidth.

Although the conventional surface acoustic wave device 110 has successfully realized a middle bandwidth as explained above, there is another major problem associated with the conventional surface acoustic wave device 110. That is, the conventional surface acoustic wave device 110 has a small impedance ratio Za/Zr. This small impedance ratio presents a problem in that, when the surface acoustic wave device 110 is used as a resonator, the surface acoustic wave device 110 cannot oscillate easily. Moreover, when a filter is constructed using the surface acoustic wave device 110, the filter experiences the disadvantages of a large insertion loss and gradual frequency characteristics at the band ends.

SUMMARY OF THE INVENTION

To overcome the problems described above, preferred embodiments of the present invention provide a surface acoustic wave device having a quartz substrate and a piezoelectric film provided thereon and a large impedance ratio Za/Zr, thereby achieving excellent oscillation characteristics, a small insertion loss and abrupt frequency characteristics at the band ends.

In one preferred embodiment of the present invention, a surface acoustic wave device includes a quartz substrate, a reflector disposed on the quartz substrate, a piezoelectric thin film disposed on an area of the quartz substrate which excludes at least a part of the quartz substrate on which the reflector is disposed and an interdigital transducer disposed in contact with the piezoelectric thin film.

The interdigital transducer may be disposed on the piezoelectric thin film. Alternatively, the interdigital transducer may be disposed between the piezoelectric thin film and the quartz substrate.

The surface acoustic wave device may further include a short-circuiting electrode disposed on the side of the piezoelectric thin film opposite to the side thereof on which the interdigital transducer is disposed.

The quartz substrate preferably has a cut angle and a propagation direction selected so as to achieve a negative temperature characteristic of group delay time. Further, the piezoelectric thin film is preferably made of a material selected from the group consisting of ZnO, AlN, $Ta_2O_5$, and CdS.

According to the surface acoustic wave device of preferred embodiments of the present invention, the reflectors are preferably disposed directly on the quartz substrate. Thus, it is possible to eliminate the reduction of the reflection coefficient and reduce the propagation loss at the reflector, thereby increasing the impedance ratio Za/Zr of the surface acoustic wave device. As a result, the surface acoustic wave device achieves excellent oscillation characteristics, and a filter constructed to include the surface acoustic wave device 10 exhibits a small insertion loss and abrupt frequency characteristics at the band ends.

For the purpose of illustrating the invention, there are shown in the drawings several forms which are presently preferred, it being understood, however, that the invention is not limited to the precise arrangements and instrumentalities shown.

DETAILED DESCRIPTION OF PREFERRED EMBODIMENTS

After discovering the problem with conventional devices described above, the inventor of the present invention intensively studied the causes of the small impedance ratio in the conventional surface acoustic wave devices having a quartz substrate and a piezoelectric film thereon. The inventor discovered that the small impedance ratio relates to a large propagation loss of a surface acoustic wave. More specifically, for the surface acoustic wave device having the structure in which the piezoelectric thin film such as a ZnO film is disposed on the quartz substrate, and the interdigital transducer and the reflectors are disposed on the piezoelectric thin film, the propagation loss of the surface acoustic wave is larger than that of a surface acoustic wave device having a structure in which an interdigital transducer and reflectors are disposed directly on a quartz substrate.

For example, in a surface acoustic wave device having a structure in which a piezoelectric thin film such as ZnO film is disposed on an ST-cut, 35° propagation quartz substrate, and an interdigital transducer and reflectors are disposed on the piezoelectric film, the propagation loss is 2.4 dB/cm at 220 MHz and 7.5 dB/cm at 630 MHz. Note that the ST-cut, 35° propagation quartz substrate mentioned in this specification includes a 25° to 35° rotated Y-cut 35°±1° X-propagation quartz substrate. On the other hand, the surface acoustic wave device having the structure in which the interdigital electrode transducer and the reflectors are formed directly on the substrate has a propagation loss of 0.05 dB/cm at 220 MHz and 0.38 dB/cm at 630 MHz.

In addition, it has been further discovered by the inventor that a reflector disposed on a piezoelectric film which is formed on a quartz substrate has one half of an amount of a reflection coefficient compared to that of a reflector directly disposed on a quartz substrate. The decrease of the reflection coefficient is caused by the phase difference of the reflected surface produced between the reflector and the piezoelectric film.

In view of the foregoing, the inventor has discovered and conceived of the following novel surface acoustic wave devices. Hereinafter, preferred embodiments of the present invention will be described with reference to the drawings.

Figure 1:
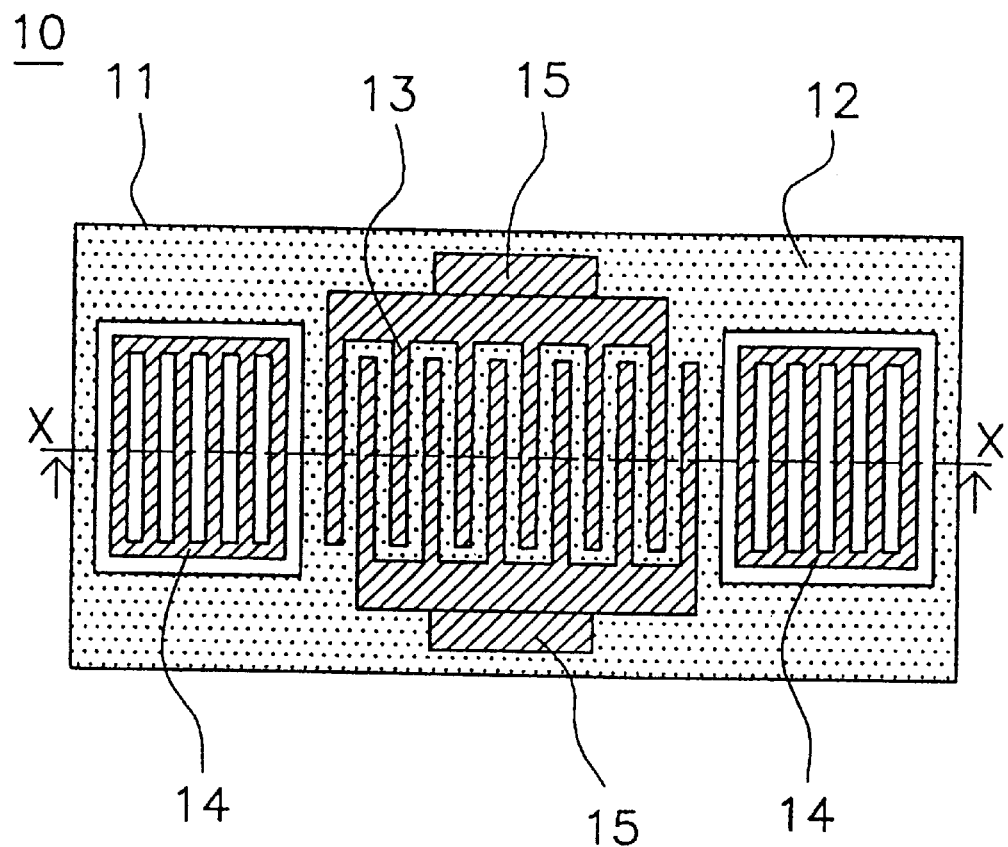
FIG. 1 is a schematic plan view of a surface acoustic wave device according to a preferred embodiment of the present invention.
Figure 2:
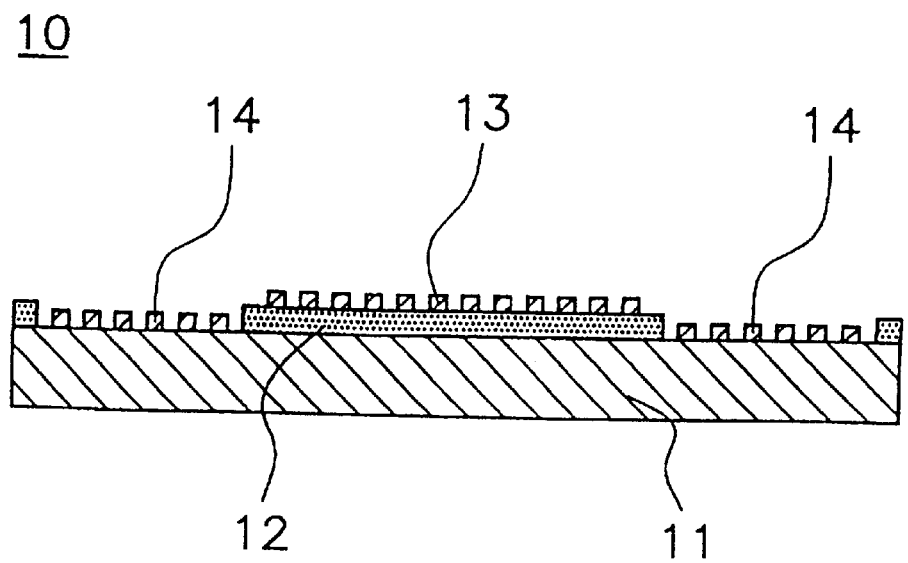
FIG. 2 is a cross-section taken along line X—X of FIG. 1.

As shown in FIGS. 1, 2, in a surface acoustic wave device 10 according to a preferred embodiment of the present invention, a piezoelectric thin film 12 which is preferably a ZnO film or the like, is disposed on an ST-cut, 35° propagation quartz substrate 11, except for a portion of the quartz substrate 11. On the piezoelectric thin film 12, an interdigital transducer 13 including a pair of comb-shaped electrodes, which are preferably metallic electrodes made of Al or the like and which are arranged so as to oppose each other, is formed by photolithograpy and other processes. On the portion of the quartz substrate 11 on which the piezoelectric thin film 12 is not formed, that is, on the opposite sides of the interdigital transducer 13, reflectors 14, which are preferably metallic electrodes made of Al and the like, are formed.

The surface acoustic wave device 10 may be sealed in a package made of ceramic or the like (not shown). A pad 15 of the interdigital transducer 13 is connected to an electrode for external connection outside of the package, via wire bonding. Thus, the surface acoustic wave device 10 functions as a resonator. It is understood that a plurality of the surface acoustic wave devices 10 may be disposed on a single quartz substrate 11 to define a filter.

According to the surface acoustic wave device 10, the reflectors 14 are preferably disposed directly on the quartz substrate. Thus, it is possible to eliminate the reduction of the reflection coefficient. In addition, the propagation loss at the reflector 14 is also reduced.

Note that the propagation path of the surface acoustic wave in the surface acoustic wave device 10 generally includes a region where the interdigital transducer is formed and a region between the interdigital transducer 13 and the reflector 14 other than the region where the reflectors 14 are disposed. Since the regions where the reflectors 14 are disposed are generally larger than the other region, the effect of reducing propagation loss is great even though the piezoelectric film is removed only at the region where the reflectors are disposed. It is further noted that the piezoelectric film between the interdigital transducer 13 and the quartz substrate 11 is necessary to increase the $K^2$ value. The piezoelectric film located in the regions between the interdigital transducer 13 and the reflectors 14 may be removed.

According to an example of preferred embodiments of the present invention, the impedance ratio Za/Zr of the surface acoustic wave device 10 is improved to 50–60 dB, while the conventional surface acoustic wave device has an impedance ratio Za/Zr of about 30–40 dB. As a result, the surface acoustic wave device 10 of preferred embodiments of the present invention achieves excellent oscillation characteristics, and a filter constructed using the surface acoustic wave device 10 exhibits a small insertion loss and abrupt frequency characteristics at the band ends.

In addition, since the piezoelectric film is provided on the quartz substrate 11 at the region where the interdigital transducer 13 is disposed, the $K^2$ value of the surface acoustic wave device 10 becomes about 1%, whereby the surface acoustic wave device 1 has a middle bandwidth and a TCD value of approximately zero.

Figure 3:
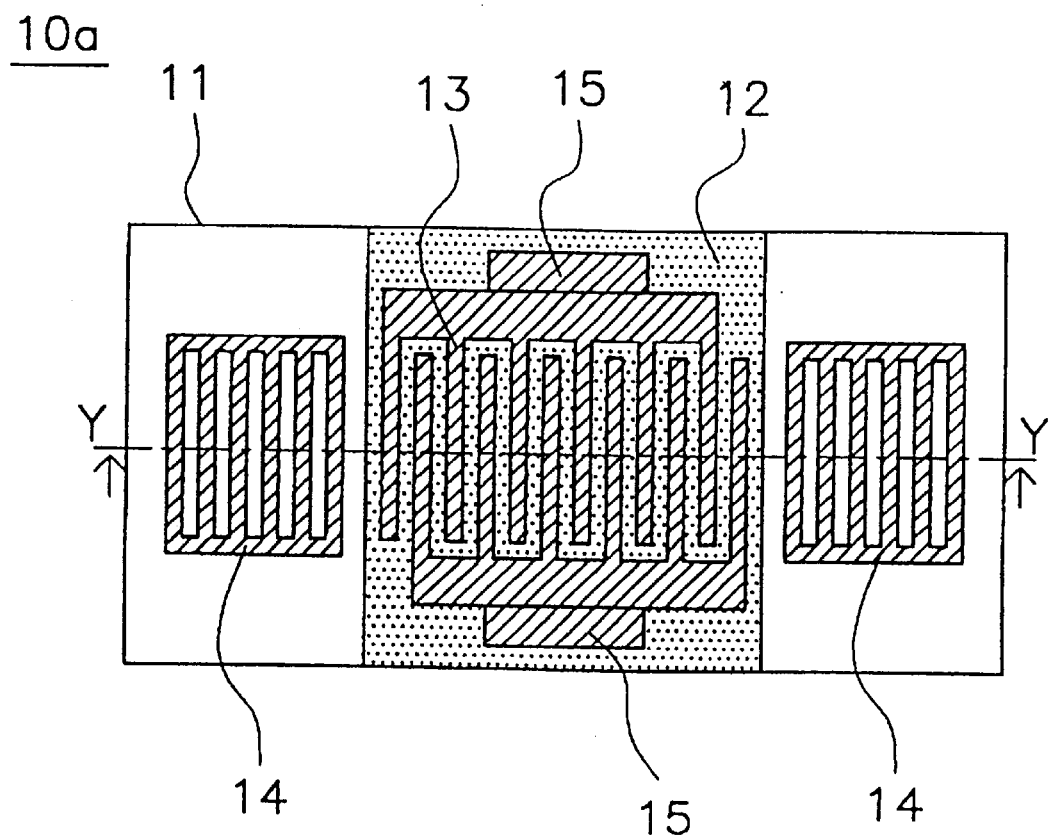
FIG. 3 is a schematic plan view of a modification of the surface acoustic wave device of the first preferred embodiment of the present invention.
Figure 4:
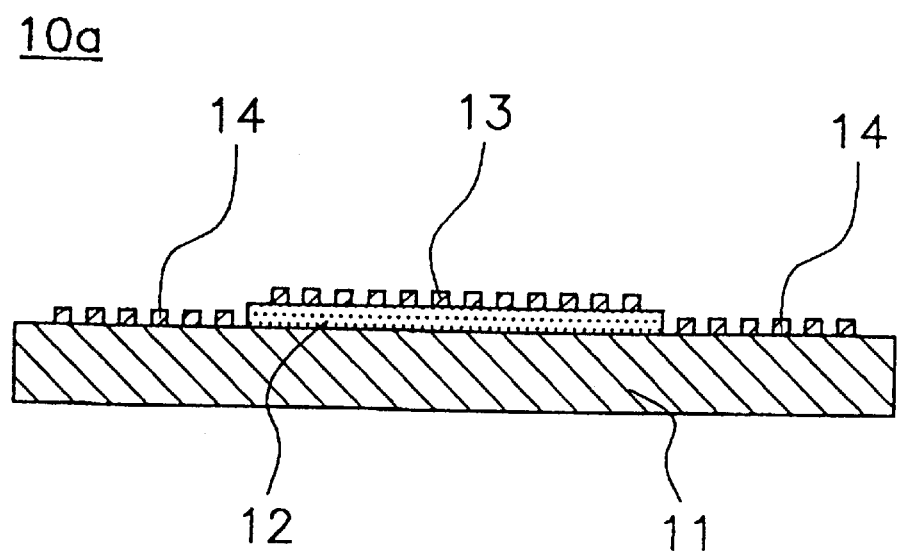
FIG. 4 is a cross-section taken along line Y—Y of FIG. 3.
Figure 5:
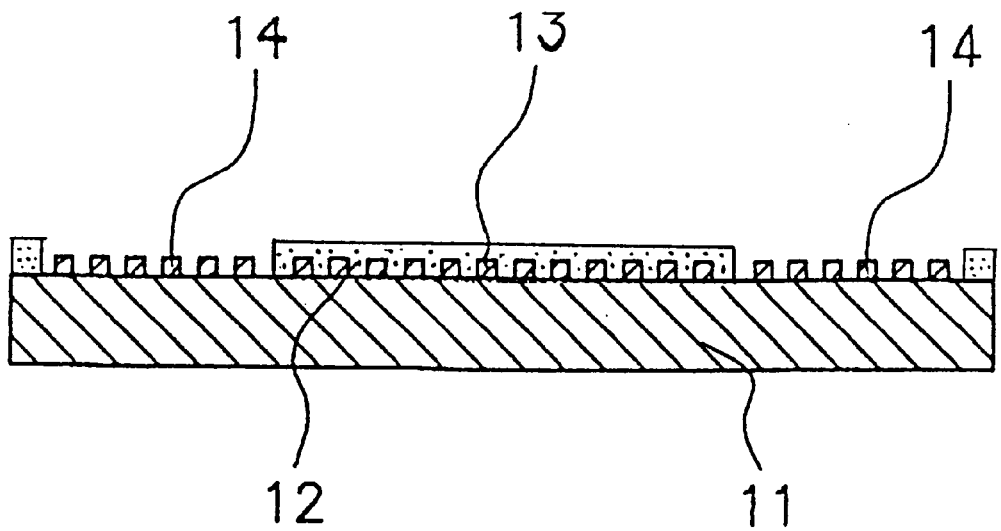
FIG. 5 is a cross-sectional view illustrating a variation of the surface acoustic wave device shown in FIG. 1.
Figure 6:
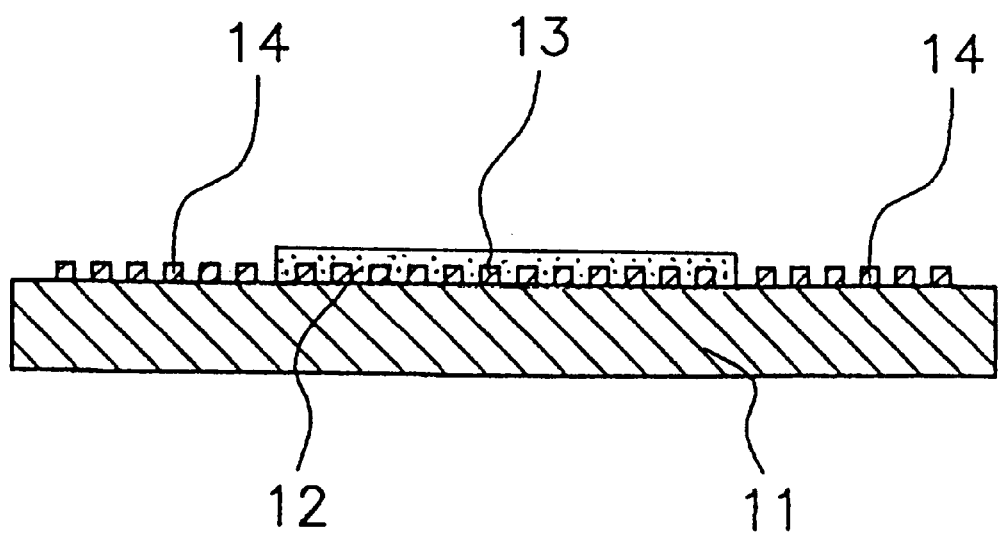
FIG. 6 is a cross-sectional view illustrating a variation of the surface acoustic wave device shown in FIG. 3.

In the structure of the above preferred embodiment, a piezoelectric thin film 12 is formed only on the portion of the quartz substrate which is disposed beneath the reflectors 14. However, as shown in FIGS. 3 and 4, the surface acoustic wave device 10a is suitable for this present invention, which has a structure in which the piezoelectric thin film 12 is provided substantially beneath the interdigital transducer 13 and is absent on the other portions of the quartz substrate 11. Further, as shown in FIGS. 5 and 6, the interdigital transducer 13 may be provided between the piezoelectric film 12 and the quartz substrate 11.

Figure 7:
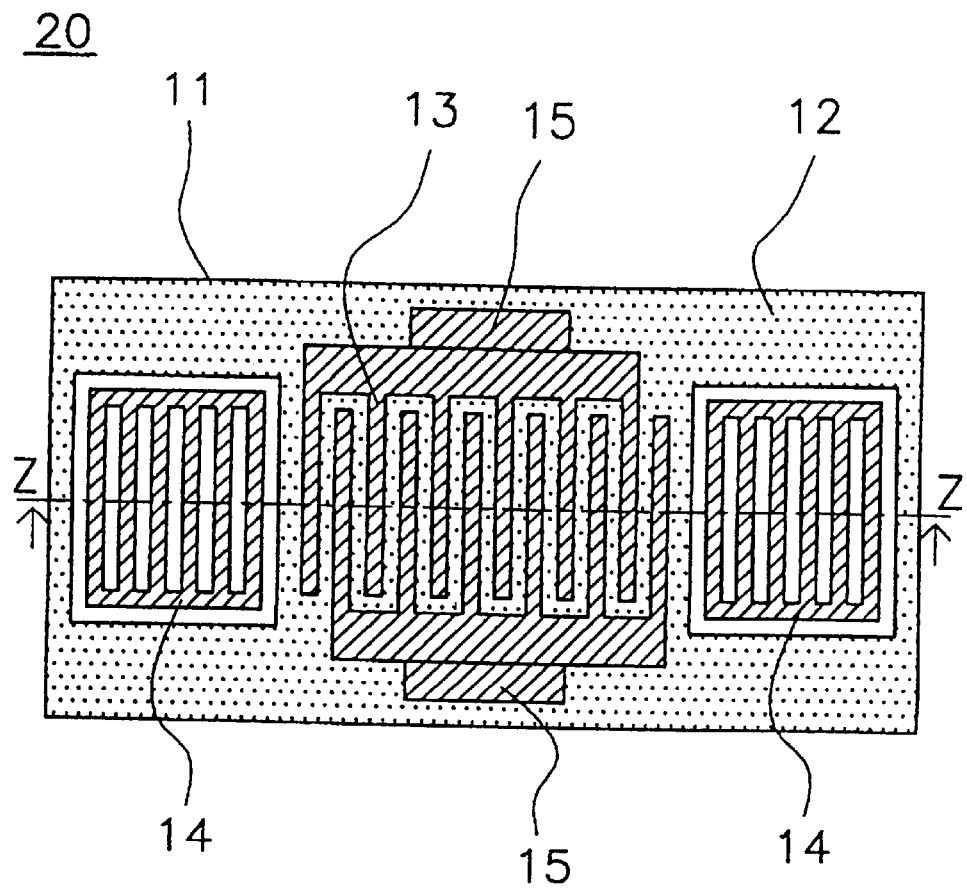
FIG. 7 is a schematic plan view of a surface acoustic wave device according to a second preferred embodiment of the present invention.
Figure 8:
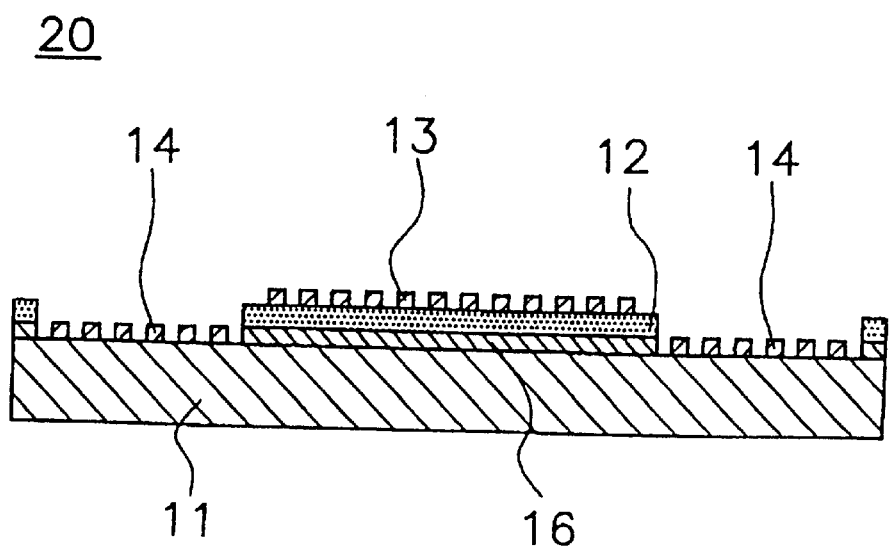
FIG. 8 is a cross-section taken along line Z—Z of FIG. 7.

A second preferred embodiment of the present invention will be now described. Like parts in this and the above-described preferred embodiments are designated by like reference numerals, and the detailed description of like parts is omitted. FIG. 7 is a schematic view of a surface acoustic wave device according to the second preferred embodiment. FIG. 8 is a cross-section taken on line Z—Z of FIG. 7.

In the surface acoustic wave device 20 according to this preferred embodiment, a short-circuiting electrode 16, which is preferably a metallic electrode made of Al or the like, is disposed on the quartz substrate 11, except for a portion of the quartz substrate 11. The piezoelectric thin film 12 is disposed on the short-circuiting electrode 16. On the piezoelectric thin film 12, the interdigital transducer 13 including a set of metallic electrodes made of Al or the like and arranged to be opposed to each other, is disposed. On the portion of the quartz substrate 11 on which the piezoelectric thin film 12 is not disposed, that is, on the opposite sides of the interdigital transducer 13, the reflectors 14 which are preferably metallic electrodes made of Al or the like, are disposed.

Providing the short-circuiting electrode 16 between the quartz substrate 11 and the piezoelectric thin film 12, as described above, the $K^2$ value of this surface acoustic wave device is even further enhanced, as compared with that of the surface acoustic wave device 10 according to the first preferred embodiment.

Figure 9:
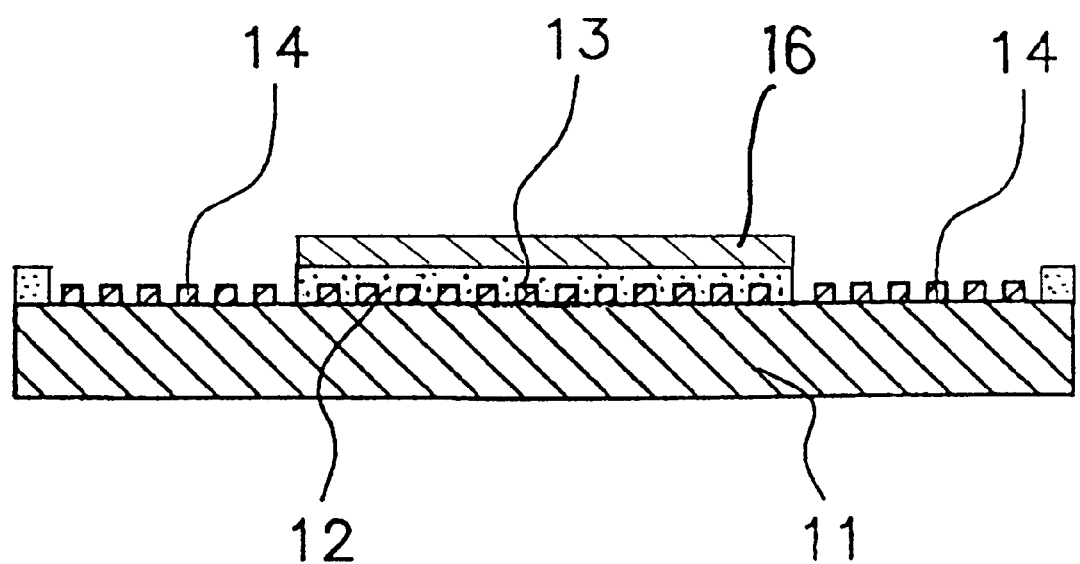
FIG. 9 is a cross-sectional view illustrating a variation of the surface acoustic wave device shown in FIG. 7.
Figure 10:
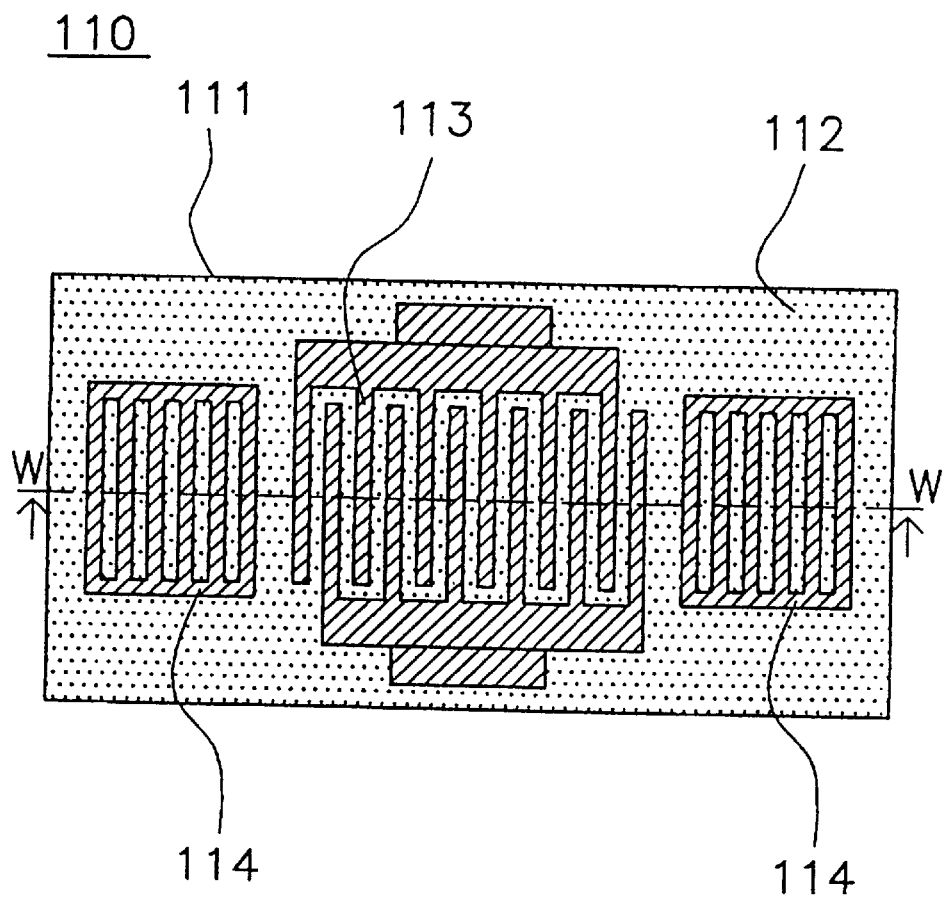
FIG. 10 is a schematic plan view of a conventional surface acoustic wave device.
Figure 11:
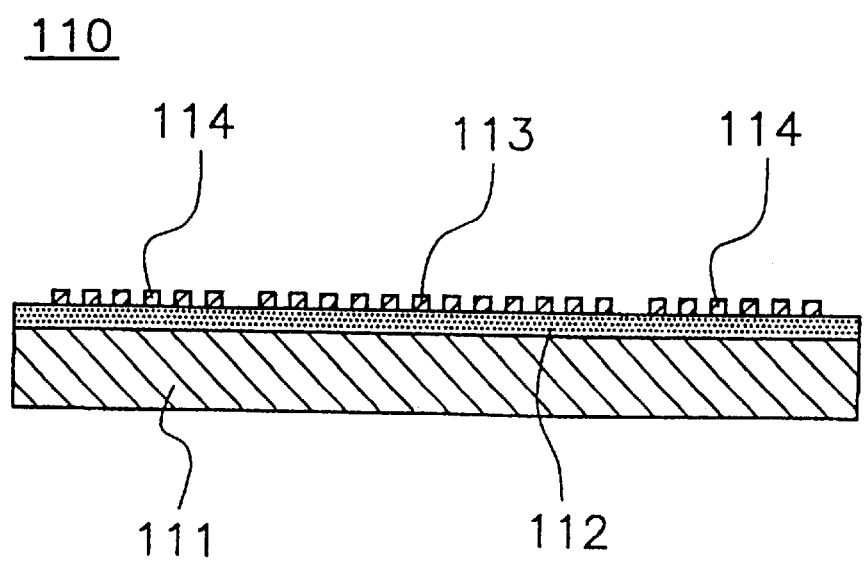
FIG. 11 is a cross-section taken along line W—W of FIG. 10.

In this preferred embodiment, the short-circuiting electrode is disposed on the quartz substrate, the piezoelectric thin film is disposed on the short-circuiting electrode, and further the interdigital transducer is disposed thereon. However, as shown in FIG. 9, the interdigital transducer 13 may be formed on the quartz substrate 11, and the piezoelectric thin film 12 and further the short-circuiting electrode 16 may be formed on the interdigital transducer 13. With this structure, the propagation loss is greatly reduced.

In these preferred embodiments, the ZnO film is preferably used as the piezoelectric thin film. However, AlN, $Ta_2O_5$, CdS, and the like may be used for the piezoelectric thin film.

Although some of the preferred embodiments described above include an ST-cut, 35° propagation direction quartz substrate, other preferred embodiments of the present invention may include other types of quartz substrates having a plurality of different cut angles and propagation directions.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic device comprising:

a quartz substrate;

a metallic reflector disposed directly on the quartz substrate;

a piezoelectric thin film located in an area of the quartz substrate which excludes at least a portion of the quartz substrate on which the reflector is disposed; and an interdigital transducer arranged to contact the piezoelectric thin film.

2. A surface acoustic wave device according to claim 1, wherein the interdigital transducer is disposed on the piezoelectric thin film.

3. A surface acoustic wave device according to claim 1, wherein the interdigital transducer is disposed between the piezoelectric thin film and the quartz substrate.

4. A surface acoustic wave device according to claim 1, further comprising a short-circuiting electrode disposed on the side of the piezoelectric thin film opposite to the side thereof on which the interdigital transducer is disposed.

5. A surface acoustic wave device according to claim 1, wherein the quartz substrate has a cut angle and a propagation direction selected to produce a negative temperature characteristic of group delay time.

6. A surface acoustic wave device according to claim 1, wherein the piezoelectric thin film is made of a material selected from the group consisting of ZnO, AlN, $Ta_2O_5$ and CdS.

7. A surface acoustic wave device according to claim 1, wherein the quartz substrate comprises an ST-cut 35° propagation quartz substrate.

8. A surface acoustic wave device according to claim 1, wherein the interdigital transducer comprises at least two metallic electrodes.

9. A surface acoustic wave device according to claim 8, wherein the metallic electrodes are made of Al.

10. A surface acoustic wave device according to claim 1, further comprising a plurality of reflectors disposed on the quartz substrate.

11. A surface acoustic wave device according to claim 11, wherein the plurality of reflectors are disposed on opposite sides of the interdigital transducer.

12. A surface acoustic wave device according to claim 10, wherein the reflectors comprise metallic electrodes.

13. A surface acoustic wave device according to claim 12, wherein the metallic electrodes are made of Al.

14. A surface acoustic device comprising:

a quartz substrate;

a metallic reflector disposed directly on the quartz substrate;

a piezoelectric thin film disposed on the quartz substrate so as to be located at opposite end regions and a central region of the quartz substrate and so as to be not located in an area of the quartz substrate where the reflector is disposed; and an interdigital transducer arranged to contact the piezoelectric thin film.

* * * * *